United States Patent [19]

Richards, Jr.

[11] Patent Number: 4,580,286
[45] Date of Patent: Apr. 1, 1986

[54] NOISE ACTIVATED MUTE FOR FM RECEPTION IN AN AM/FM RADIO RECEIVER

[75] Inventor: Oliver L. Richards, Jr., N. Grosvenor Dale, Conn.

[73] Assignee: Sprague Electric Company, North Adams, Mass.

[21] Appl. No.: 593,157

[22] Filed: Mar. 26, 1984

[51] Int. Cl.⁴ .............................. H03J 7/18; H04B 1/10
[52] U.S. Cl. ...................................... 455/168; 455/194; 455/212; 455/222; 455/200
[58] Field of Search ............... 455/161, 168, 194, 200, 455/212, 218, 219, 222

[56] References Cited

U.S. PATENT DOCUMENTS

| | | | |
|---|---|---|---|
| 3,626,294 | 12/1972 | Dancy . | |
| 3,628,046 | 12/1971 | Bilotti . | |
| 4,107,613 | 8/1978 | Queen et al. | 455/212 |
| 4,330,866 | 5/1982 | Malchow | 455/161 |
| 4,397,040 | 8/1983 | Jandel et al. | 455/219 |

FOREIGN PATENT DOCUMENTS

| | | | |
|---|---|---|---|
| 11509 | 2/1978 | Japan | 455/168 |
| 27535 | 3/1981 | Japan | 455/218 |

OTHER PUBLICATIONS

"Advanced FM-IF" by Wile, 6/11/82, *IEEE Transactions on Consumer Electronics*, vol. CE-28, No. 3, pp. 383-392.

*Primary Examiner*—Jin F. Ng

[57] ABSTRACT

In an integrated AM-FM radio circuit connected for operation in the FM mode, the voltage appearing across the normally unused AM tank at the IF amplifier is noise in that AM band centered at 455 KHz. That noise, which is present only when the IF amplifier is not limiting due to the presence of an FM signal therein, is used for muting the receiver. The noise is passed through a simple IC-on-board low pass filter to a noise detector and then to a voltage controlled attenuator to attenuate the demodulated audio from the FM detector to the audio amplifier.

8 Claims, 5 Drawing Figures

NOISE ACTIVATED MUTE FOR FM RECEPTION IN AN AM/FM RADIO RECEIVER

BACKGROUND OF THE INVENTION

This invention relates to radio receivers capable of operating in either an FM or an AM mode and having an automatic noise muting feature in the FM operating mode.

In FM reception, such muting has been known as squelching, interstation-noise suppression or quiet automatic-volume control. It's purpose is to shut off or attenuate the audible noise that is heard when either the station to which the receiver is tuned ceases to transmit or when scan tuning the receiver between transmitting stations whether manually or by automatic means. The noise is generated in the receiver itself in the antenna and in the atmosphere. When alone it is normally demodulated by the FM detector and will, unless muted or blocked, produce disquieting audible noise. When the receiver is tuned to a strong radio signal, the receiver goes into limiting and the noise is preempted by the signal.

Generally, muting has been accomplished by either one of two ways, (a) by unblocking the audio channel in response to a large signal or (b) by blocking the audio channel in response to the presence of noise from the IF amplifier which indicates the absence of radio signal limiting. In some radio designs both are employed simultaneously.

The second means (b) can provide a more reliable measure of the limiting that is effected only by the presence of the desired (tuned-in) radio signal, because it admits of the use of a high quality band pass filter to eliminate signal frequencies outside this band that may be falsely recognized as noise. Thus the second means (b) generally imbues a radio with superior performance. However, such high quality filters must employ discrete components and thus represent a high cost factor in a radio that is for the most part composed of one or more integrated circuits.

It is therefore an object of this invention to provide a high performance FM noise-activated mute in a radio capable of operation in an FM or an AM reception mode.

It is a further object of this invention to provide such a radio comprising integrated circuits wherein high performance is obtained without a high-quality discrete-components filter leading to low manufacturing costs.

SUMMARY OF THE INVENTION

A superheterodyne radio receiver, capable of operation in either an AM mode or an FM mode includes a broadband IF amplifier having an output connected to an AM tank circuit and to an FM tank circuit. An AM detector and an FM detector are connected to the AM and FM tank circuits, respectively.

A noise detector means is connected to the AM tank circuit. When a mode switch means connects the FM detector output to an audio amplifier, the noise detector means has three functions. It detects the IF noise across the AM tank circuit; it provides one type output signal when the radio receiver is tuned to an FM station signal that is strong enough to effect limiting in the IF amplifier and thus reducing the noise from the IF amplifier and across the AM tank circuit; and it provides another type output signal when the receiver is tuned away from an FM station signal in response to the noise generatad in the IF amplifier and across the AM tank circuit.

A voltage controlled attenuator is connected between the output of the FM detector and the mode switch and attenuates the audio signal from the FM detector to the audio amplifier in response to the presence of the another signal from the main detector means.

DESCRIPTION OF THE PREFERRED EMBODIMENTS

Figure 1:
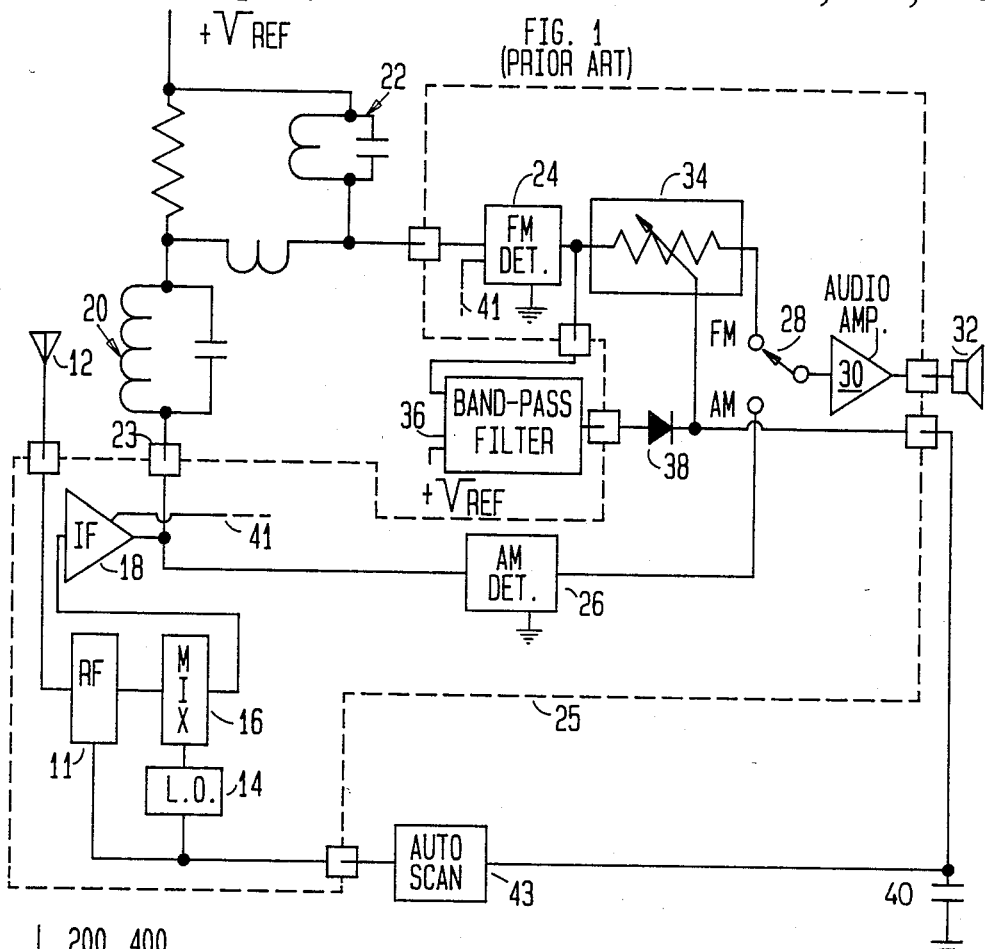
FIG. 1 shows a block diagram of an integrated circuit AM-FM radio of the prior art.

Typical features of AM-FM radios made today are shown in block diagram of FIG. 1. It is a superheterodyne receiver including an electronically tunable RF input section 11 that may be connected to an external antenna 12, and electronically tunable local oscillator (L.O.) 14 and a mixer 16 wherein the FM and L.O. frequencies are mixed or beat to generate an intermediate frequency (IF). It further includes a broad band IF amplifier 18, that has a load made up to two serially connected tank circuits 20 and 22. Tank 20 is tuned to a conventional frequency for AM signals, e.g. 455 KHz, while tank 22 is tuned to a conventional frequency for FM signals, e.g. 10.7 MHz.

The tank circuits 20 and 22 are connected in a series circuit between a DC power supply (not shown) and a pad 23 of an integrated circuit 25 that is indicated by a broken line in FIG. 1. An FM detector 24 is essentially connected directly across the FM tuned tank 22, but the AM detector 26 is connected across both tanks 20 and 22. The AM detector 26 could therefore be presented with either AM-IF or FM-IF signals were it not for the fact that the frequency selective RF section 12 essentially filters out FM signals when the radio is connected in the AM operational mode.

When AM signals are to be received, the operational mode switch 28 connects the output of the AM detector 26 to the input of the audio amplifier 30. A speaker 32 is shown connected to the output of the amplifier 30. It will be recognized that the simplified diagram of the AM-FM radio of FIG. 1 omits other switches that are ganged with switch 28 to change frequency selective circuits in the RF section 11 and local oscillator 14. The IF amplifier is a broad band amplifier whose bias may be changed in the FM mode of operation to more readily "limit" by yet another ganged switch that is omitted here for clarity.

When FM signals are to be received, the operational mode switch 28 connects the output of the FM detector 24 through a voltage controlled attenuator 34 to the audio amplifier 30. The attenuator 34 is preferably a double balanced gate circuit as is described by Bilotti in the patent U.S. Pat. No. 3,628,046 issued Dec. 14, 1971 and assigned to the same assignee as is the present invention. The FM output is also connected to a band-pass filter 36, a rectifier 38 serving as another AM detector, and a capacitor 40. Another of Bilotti double balanced gate circuits is used for the FM phase-discriminating detector 24. The phase reference voltage is obtained from an intermediate stage of the IF amplifier 18 via line 41, internal to the integrated circuit chip 25.

At the output of the detector 38 there is developed a voltage for controlling the attenuator 34. In this way an automatic attenuation or muting of the audio signal is effected when a weak FM signal, or no FM signal, is being received, because under these conditions there is no limiting taking place in the IF amplifier 18. The IF amplifier noise is within the bandwidth of the FM tank circuit 22. Therefore, this noise is detected by rectifier 38 to produce a high voltage at the detector output that will produce a high attenuation of the audio signal through attenuator 34.

The band-pass filter 36 gets rid of IF signals that are produced by certain RF signals and that would be interpreted by the automatic muting system as noise. For example, consider that the radio is tuned to an FM signal that is strong enough to cause limiting in the IF amplifier. No noise would be detected by the rectifier 38 and control voltage at the output of the detector 38 would be essentially zero and there would be no attenuation of the audio signal. However, if in addition there are one or two very strong FM signals at the antenna 12 that are only one channel away (200 KHz away) or even two channels away (400 KHz away), some of that strong adjacent channel will get through the frequency selective tuned RF section 11.

At least two carriers including the 10.7 MHz carrier 39 will then appear in the IF amplifier 18 which are 200 KHz or 400 KHz apart. In the spectrum of heterodyned signals of FIG. 3, there are shown the relative spectral positions of the two IF signals 42 and 44 at 10.5 MHz and 10.9 MHz respectively, which are the result of the mixing with the local oscillator of two adjacent channel radio station signals. Now if both appear at the FM detector 24 (or the AM detector 26) then a beat-frequency signal 46 of 400 KHz is produced. Either one of signals 42 and 44 will beat in the FM detector with the 10.7 MHz carrier of the signal to which the receiver is tuned and produce a 200 KHz signal 48.

The 200 KHz (or 400 KHz) signal is capable of being detected by rectifier 38 and causing the attenuator 34 to mute the "good" station to which the radio is tuned. The band pass filter 36 prevents this by removing such unwanted signals. Filter 36 may advantageously have a band pass of 80–150 KHz. Such filters typically include about six discrete components, i.e. coils, capacitors and resistors and are thus rather expensive.

Figure 2:
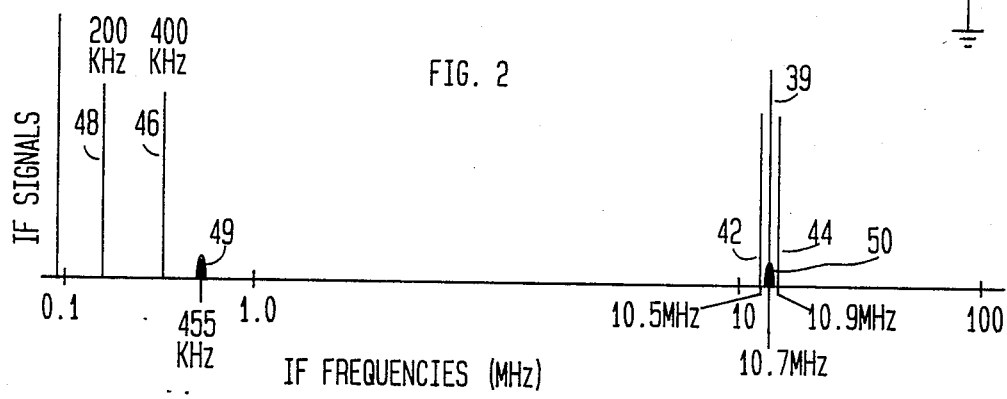
FIG. 2 shows graphically the relative positions in the frequency spectrum of various IF signals and bands.

Superimposed on the signal spectrum of FIG. 2 are bell shaped symbols 49 and 50 representing the band pass characteristics of the AM and FM tank circuits 20 and 22, respectively. The band pass of the FM frequency selective network including tank 22 is 10.7 MHz±90 KHz.

Another feature of the contemporary integrated circuit radio also shown in FIG. 1, is an automatic scan tune capability. The automatic scanner 43 in FIG. 1 generates a voltage to control the tuning of the local oscillator 14 and RF section 11. It causes these elements to repetitively scan the FM broadcast band and stops when an input voltage indicates the reception of a good quality FM signal. The mute-control voltage at the output of detector 38 is used as this scan stop signal also.

Figure 3:
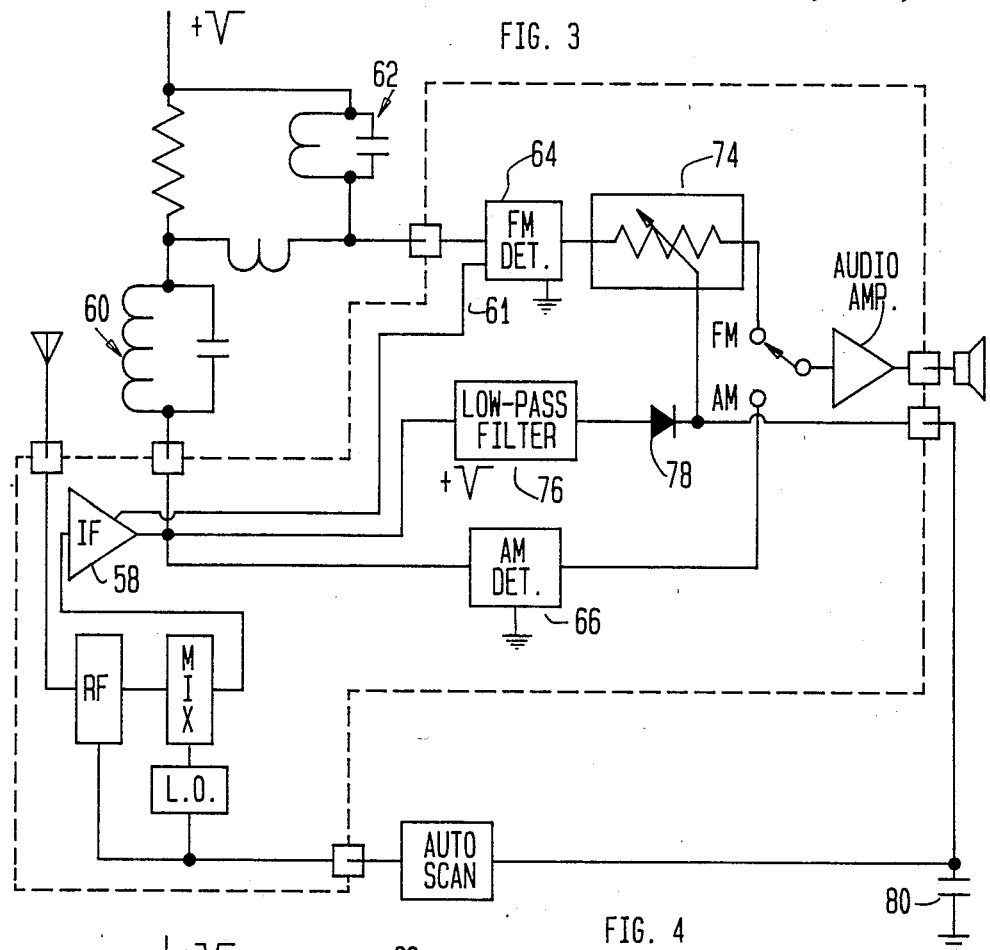
FIG. 3 shows in block diagram a key portion of a radio that represents a preferred embodiment of this invention.

In the preferred embodiment of the invention, the radio illustrated in FIG. 3 consists of a superheterodyne radio employing the same conventional electronically tuned front end and single broad band IF amplifier serving to pass both the AM-IF and FM-IF signals. Also, the IF amplifier 58 is connected to the AM-IF tank 60 and FM-IF tank 62 in the very same manner as were their counterparts 18, 20 and 22, respectively, in FIG. 1. Also similarly the FM detector 64 and AM detector 66 are likewise connected in the same manner to tanks 60 and 62. The IC conductor 61 provides the phase reference signal from the IF amplifier 58 and the FM detector 64.

Thus when the radio is operated in the FM mode, the normally unused AM tank is employed to see the bandwidth of noise that will activate the voltage controlled attenuator 74, and a low cost on-board low pass filter 76 defends against the threat that adjacent-channel signals will mute perfectly good quality stations.

The control voltage for attenuator 74, however, is derived in a unique manner. While operating in the FM mode, the attenuator control voltage is generated by IF noise that is passed by the AM tank 60. This tank 60 is tuned to 455 KHz with a bandpass of from 445 KHz to 465 KHz. This noise generated in the IF amplifier, when there is no strong signal being received, is selectively filtered by the AM tank 60 and passed through the low pass filter 76 where it is subjected to AM detection by rectifier 78 in conjunction with shunt connected capacitor 80. That noise is limited to frequencies between 445 and 465 KHz.

Now, if the above mentioned adjacent channel IF signals at 10.5 MHz and or 10.9 MHz are present in the IF amplifier 58, they are eliminated by the low-pass filter 76 that has an upper 6 db attenuation point at about 500 KHz. Thus adjacent-channel IF signal do not cause false-muting.

This simple low pass filter 76 may be included in the integrated circuit chip itself, consisting only of an integrated diffused resistor and a p-n junction capacitor (not illustrated).

Thus when the radio is operated in the FM mode, the normally unused AM tank is employed to set the bandwidth of noise that will activate the voltage controlled attenuator 74, and a low cost on-board low pass filter defends against the threat that adjacent-channel signals will mute good quality stations.

Figure 5:
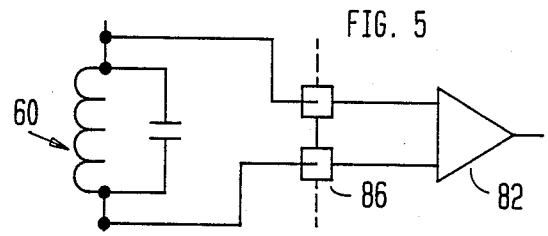
FIG. 5 shows a further modified portion of the circuit in FIG. 4.
Figure 4:
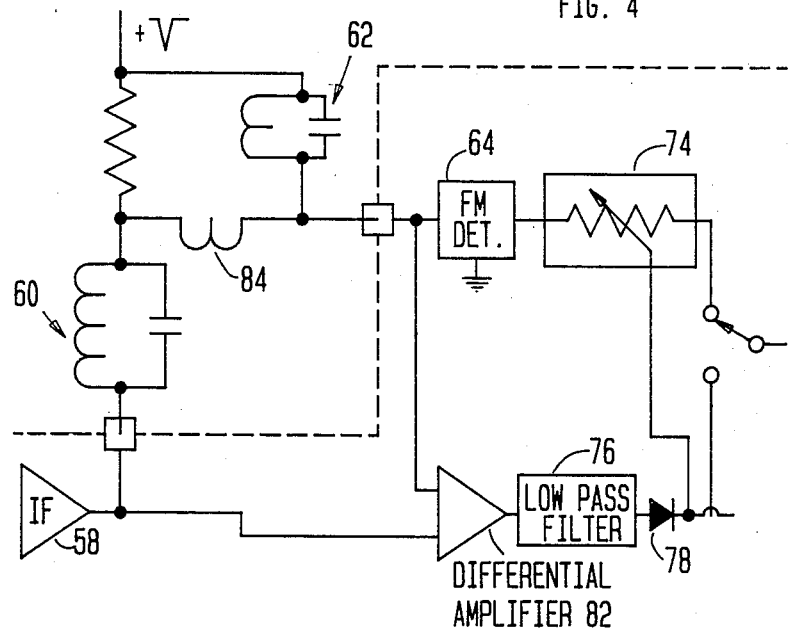
FIG. 4 shows a modified portion of the radio circuit of FIG. 3 representing a second preferred embodiment of this invention.

In a second preferred embodiment of this invention, the noise developed across the AM tank circuit exclusive of voltages developed across the FM tank may be tapped for muting. This may be accomplished by imposing the (noise) voltage across the AM tank 60 in FIG. 3 to the balanced high impedance input of a standard differential amplifier 82 as shown in FIG. 4. Even more exclusively, avoiding picking up voltages developed across the small coil 84, yet another alternative as indicated in FIG. 5 is to connect the input of differential amplifier 82 directly across the AM tank 60. This may make it possible to eliminate the low pass filter 76 altogether because the adjacent channel IF signals 42 and 44 in FIG. 3 will now be more surley directed away from the muting circuits. However, an additional IC terminal pad 86 would be needed.

What is claimed is:

1. A superheterodyne radio receiver, capable of operation in an AM mode and optionally in an FM mode, having a broadband IF amplifier; an AM and FM tank circuit each connected to the output of said IF amplifier, said AM tank circuit being tuned to an AM-IF frequency and having a fixed bandwidth and said FM tank circuit being tuned to an FM-IF frequency that is substantially higher than said AM-IF frequency; an AM detector and an FM detector being connected to said AM and FM tank circuits respectively; and audio amplifier; and an AM-FM mode switch means for optionally connecting either said AM detector output or said FM detector output to the input of said audio amplifier; wherein the improvement comprises (a) a noise detector means being connected to said AM tank circuit
for detecting the IF noise across said AM tank circuit when said mode switch means connects said FM detector output to said audio amplifier,
for providing one type output signal when said radio receiver is tuned to the frequency of an FM station signal that is strong enough to effect limiting in said IF amplifier and to reduce the noise from said IF amplifier and across said AM tank circuit to near zero, and
for providing another type output signal when said radio receiver is tuned away from an FM station frequency in response to the noise generated in said IF amplifier and across said AM tank circuit; and (b) a voltage controlled attenuator means for effecting connection of said FM detector output to said mode switch means and for attenuating the audio signal from said FM detector to said audio amplifier in response to the occurrence of said another type output signal from said noise detector means.

2. The radio receiver of claim 1 said AM noise detector means is comprised of a rectifying detector followed by a shunt-connected capacitor, the voltage across said capacitor serving as said output signal of said one and another type.

3. The radio receiver of claim 2 wherein said AM noise detector means additionally comprises a filter means for passing noise signals of frequencies at least over the frequency range commensurate with the bandpass characteristic of said tuned AM tank circuit to said rectifying detector and for blocking signals of frequencies at least over the frequency range commensurate with the bandpass of said tuned FM tank circuit.

4. The radio receiver of claim 2 wherein said rectifying detector is connected to said AM tank circuit via a low pass filter having a bandpass up to about 500 KHz to filter out FM-IF radio signals generated by radio stations in channels adjacent to that to which the radio is tuned.

5. The receiver of claim 1 wherein said noise detector means includes a first circuit stage consisting of a differential amplifier having the two differential inputs connected across said AM tank circuit exclusive of said FM tank circuit.

6. The receiver of claim 5 wherein said two differential inputs are connected directly across said AM tank circuit.

7. A superheterodyne radio receiver, capable of operation in an AM mode and optionally in an FM mode, comprising:

(a) a broadband intermediate-frequency (IF) amplifier;

(b) an AM tank circuit that is fixedly tuned to an AM intermediate frequency;

(c) an FM tank circuit that is fixedly tuned to an FM intermediate frequency, said AM and FM tank circuits being connected in series with each other, an end of said AM tank circuit being connected to the output of said IF amplifier, and an end of said FM tank circuit being connected to a signal ground point in said radio;

(d) an FM detector having an input connected across said FM tank circuit;

(e) an AM detector having an input connected across said AM tank circuit;

(f) a low pass filter having a bandpass encompassing that of said fixedly tuned AM tank circuit, the input of said filter being connected across said AM tank circuit;

(g) an audio amplifier;

(h) a manually operable mode switch means for connecting said audio amplifier to either said FM detector or said AM detector; and (i) a voltage controlled attenuator means for providing the audio signal connection between said FM detector and said switch means and for attenuating the audio signal in that connection when the output from said low pass filter is high and above a predetermined value.

8. The receiver of claim 7 wherein said IF amplifier, said FM detector, said audio amplifier, said low pass filter, and said voltage controlled attenuator are formed in a silicon integrated circuit chip.

* * * * *